United States Patent [19]

Lai

[11] Patent Number: 4,943,945
[45] Date of Patent: Jul. 24, 1990

[54] REFERENCE VOLTAGE GENERATOR FOR PRECHARGING BIT LINES OF A TRANSISTOR MEMORY

[75] Inventor: Fang-shi Lai, Baldwin, N.Y.

[73] Assignee: International Business Machines Corporation, Armonk, N.Y.

[21] Appl. No.: 365,579

[22] Filed: Jun. 13, 1989

[51] Int. Cl.$^5$ .............................................. G11C 7/00
[52] U.S. Cl. ................................ 365/189.09; 365/203; 365/204; 307/360; 323/313
[58] Field of Search ................... 365/203, 204, 189.09; 307/296.8, 360; 323/311, 312, 313

[56] References Cited

U.S. PATENT DOCUMENTS

| | | | |
|---|---|---|---|
| Re. 30,586 | 4/1981 | Brokaw | 323/314 |
| 3,631,528 | 12/1971 | Green | 307/570 |
| 3,806,742 | 4/1974 | Powell | 323/313 X |
| 3,832,644 | 8/1974 | Nagata et al. | 330/22 |
| 3,922,569 | 11/1975 | Nabetani et al. | 307/350 |
| 3,942,046 | 3/1976 | Limberg | 307/296.6 |
| 4,430,582 | 2/1984 | Bose et al. | 307/296.6 |
| 4,518,873 | 5/1985 | Suzuki et al. | 307/451 |
| 4,518,880 | 5/1985 | Masuda et al. | 307/296.8 X |
| 4,563,594 | 1/1986 | Koyama | 307/290 |
| 4,585,955 | 4/1986 | Uchida | 307/296.7 |
| 4,633,442 | 12/1986 | Borghese | 365/189.09 |
| 4,658,156 | 4/1987 | Hashimoto | 365/189.09 X |
| 4,672,304 | 6/1987 | Degrauwe et al. | 323/314 |
| 4,714,872 | 12/1987 | Traa | 323/314 |
| 4,733,112 | 3/1988 | Yamaguchi | 307/530 |
| 4,821,233 | 4/1989 | Hsieh | 365/203 |
| 4,893,275 | 1/1990 | Tanaka et al. | 323/313 X |

OTHER PUBLICATIONS

IEEE Journal of Solid State Circuits, vol. SC-21, No. 5, Oct. 1986, "A 50-A Standby 1Mx1/256Kx4 CMOS DRAM W/High Speed Sense Amplifier".
IEEE Transactions on Electron Devices, vol. ED-33, No. 4, Apr. 1986.
IEEE Journal, vol. SC-19, No. 4, Aug., 1984, "Half-$V_{DD}$ Bit Line Sensing Scheme in CMOS DRAMs".
IEEE Journal Solid State Circuits, vol. SC-21, No. 5, Oct. 1986, "25-ns 256Kx1/64Kx4 CMS SRAMs".

*Primary Examiner*—Stuart N. Hecker
*Assistant Examiner*—Alyssa H. Bowler
*Attorney, Agent, or Firm*—Pollock, Vande Sande & Priddy

[57] ABSTRACT

Threshold generator for generating half-VDD sensing potential. The threshold generator will precharge all bit lines of a memory array to $\frac{1}{2}$-VDD prior to beginning a read of the memory array contents. First and second inverter circuits have threshold voltages selected to represent voltage limits for the bit lines. A voltage drive means is connected to the bit lines along with the inverter circuit inputs. The inverter circuit outputs enable the drive means to supply current or discharge current to and from the bit lines to maintain a voltage potential within the selected voltage limits.

6 Claims, 3 Drawing Sheets

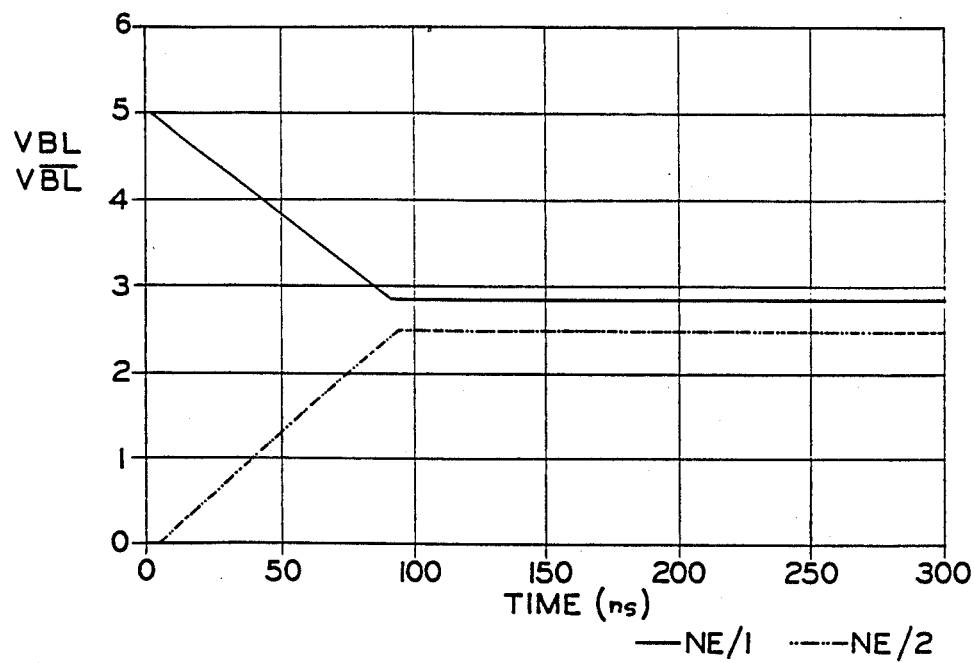
FIG_5
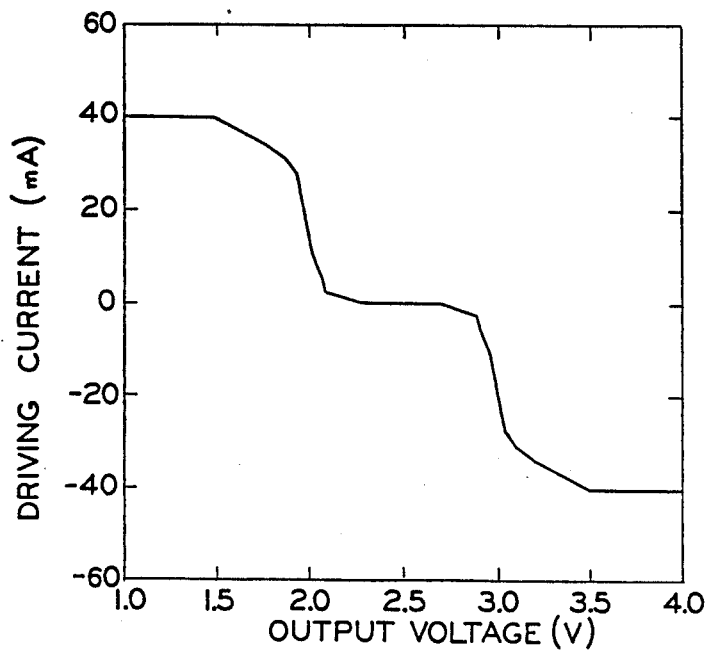
FIG_6

REFERENCE VOLTAGE GENERATOR FOR PRECHARGING BIT LINES OF A TRANSISTOR MEMORY

The present application relates to the semiconductor memory art. Specifically, a circuit for precharging bit lines of a transistor memory which uses half-VDD sensing is described.

MOS memory arrays employ sense amplifiers to determine the state of individual memory cells which are being decoded. An addressed memory cell in a static memory device is sensed on a bit line to determine the relative charge on the memory cell representing a binary 1 or 0. The sensed charge is used to set a latch comprising the sensing amplifier.

The bit lines are connected to the nodes of the sense amplifier latch. During a READ operation of a decoded memory cell, the latch assumes a state determined by the logic state of the two bit lines BL and $\overline{BL}$. Prior to reading the charge on a memory cell, the bit lines are precharged to an equal potential. It has been reported in several papers, including "Half-VDD Bit-Line Sensing Scheme in CMOS DRAMs" Lu and Chao, IEEE Journal of Solid State Circuits, August 1984, Vol. Sc19, No. 4, and, "50-UA Standby 1MX1/256KX4 CMOS DRAM With High Speed Sense Amplifier", Fuji et al, IEEE Journal of Solid State Circuits, Vol. SC-21, No. 5, October 1986, advantages are obtained by precharging the bit lines to be half of the full binary logic state voltage VDD.

The implementation of half-VDD sensing requires a reference voltage generator for precharging the bit lines BL, $\overline{BL}$ to a potential of approximately one half-VDD.

The voltage generator must be power efficient not adding significant power consumption to the memory array. It is at the same time necessary to supply relatively large current levels to the bit lines BL, $\overline{BL}$ to precharge all of the bit lines in a brief precharge interval preceding reading of the memory cell. The additional constraint in high density MOS circuitry of keeping the number of circuit elements to a minimum makes realization of these objectives more difficult.

SUMMARY OF THE INVENTION

It is an object of this invention to provide a threshold voltage generator for precharging bit lines of a memory array.

It is a more specific object of this invention to provide a threshold voltage generator which may be implemented in CMOS integrated circuits.

It is yet a more specific object of this invention to provide a threshold voltage generator which is used in half-VDD sensing for transistor memory arrays.

These and other objects of the invention are provided for a circuit which may be implemented in CMOS technology and provides substantially high charging and discharging currents to bit lines of a transistor memory array. The circuit has a quiescent power dissipation which is due only to leakage current when implemented in CMOS technology. The overall power consumption of the transistor array is thus not appreciably increased using the threshold generator.

In carrying out the invention, first and second inverter circuits are provided. Each inverter is selected to have a different threshold voltage defining an upper and lower limit for the reference potential used in half-VDD sensing. The inverter inputs are connected together to form a bit line drive terminal.

Each of the inverters have outputs connected to a bit line driving circuit for supplying a charging current and for receiving a discharging current. The driving circuit is connected to the bit line drive terminal.

In operation, the bit line potential is sensed by each inverter. If this bit line potential is below the lower limit of the reference potential, current will be supplied to the bit line by the drive circuit until the lower limit of the reference potential is reached, at which time the first inverter output state switches and the drive circuit ceases charging the bit line.

In the event excessive potential occurs on the bit line, the second inverter will change state, resulting in current being discharged from the bit line by the drive circuit. When the bit line potential is reduced to below the second inverter threshold, the drive circuit ceases discharging the bit line.

DESCRIPTION OF THE FIGURES

FIG. 5 illustrates the response time for the circuit to precharge the bit lines.

FIG. 6 illustrates the current driving-sinking capabilities for the circuit of FIG. 2.

DESCRIPTION OF THE PREFERRED EMBODIMENT

Figure 1:
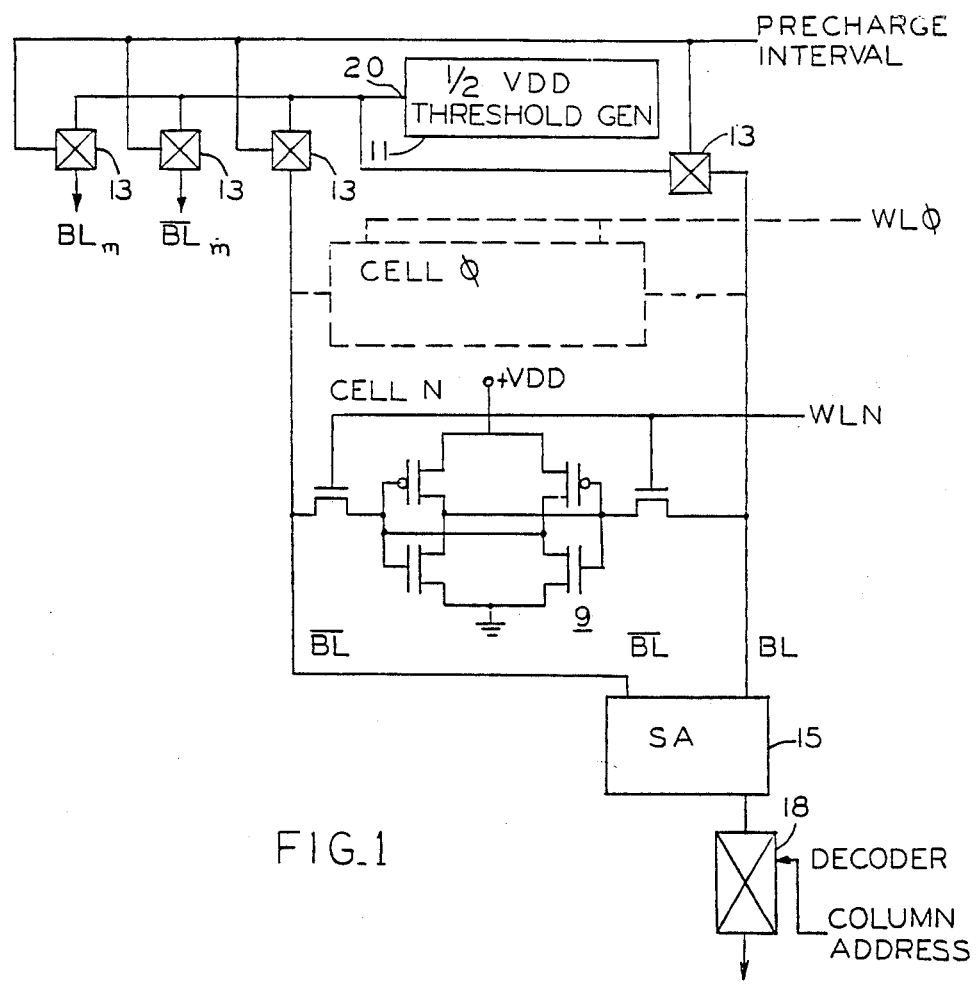
FIG. 1 illustrates an implementation of half-voltage sensing in SRAM arrays.

Referring now to FIG. 1, there is shown a schematic diagram of a column of memory cells $\phi$-N. These memory cells are typical of static RAM architecture, wherein a plurality of NMOS and PMOS FETs are arranged to store a static charge corresponding to a binary 1 or 0. Each of the memory cells is part of a column and row of memory cells comprising a memory matrix. A word line enable signal is shown which permits the addressing of cells in a given row of the matrix. The particular memory cell addressed by a word line address will be read in a corresponding sense amplifier 15. The sense amplifier 15 Will store the value of the binary digit and its complement as BL and $\overline{BL}$. All the cells comprising a column are connected to a bit line BL and complementary bit line, $\overline{BL}$. Thus, upon the address of a word line one of the cells of each column will be read and sensed by an appropriate sense amplifier.

In the half-VDD bit sensing scheme, the bit lines BL and $\overline{BL}$ are precharged to $\frac{1}{2}$ the voltage VDD corresponding to a logic state for the memory cell 8 or 9. The charging of the bit lines BL and $\overline{BL}$ occurs just prior to a read operation commencing with the word line WLN ENABLE being in a logic 1 condition. Thus, a precharge interval occurs just before reading each row of cells.

Precharging of the bit lines BL and $\overline{BL}$ occurs by enabling switches 13. During the precharge interval this will permit charging of the bit lines BL and $\overline{BL}$ to a voltage supplied by the threshold generator 11. In half-VDD sensing, this voltage level is approximately $\frac{1}{2}$ the cell potential VDD representing a binary 1 state.

As is common to other memory architecture, a decoder 18 selects a sense amplifier 15 corresponding to a column address.

In the half-VDD sensing scheme, each pair of bit lines (BL and $\overline{BL}$) is, during the precharge interval, precharged to approximately ½-VDD by a plurality of gates 13, each connected to the threshold generator 11.

Figure 2:
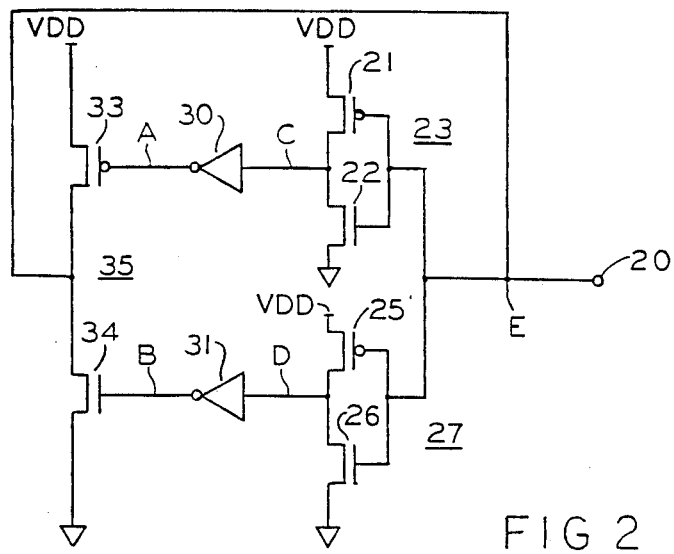
FIG. 2 illustrates a preferred embodiment of the invention.

The present invention contemplates a specific threshold generator 11 which will not contribute in any material way to the power dissipation of the memory array, yet supply upwards to 50 mA amps of current for charging all the bit lines of the memory. Referring now specifically to FIG. 2, there is shown an embodiment of the present invention which will permit charging of the bit lines to a voltage level which is within a threshold range. First and second inverters 23 and 27 are provided which have inputs connected to a bit line driving terminal 20, also corresponding to the output of the threshold generator. The first inverter 23 comprises a PMOS FET 21 connected to a source of voltage equal to VDD connected in series with an NFET 22. The PFET 21 and NFET 22 are connected across a voltage supply having a potential of VDD volts.

A second inverter 27 is shown, also comprising a PMOS FET 25 and NMOS FET 26 serially connected across the same voltage supply VDD. The inputs to these inverters are connected in common to the bit line terminal 20.

Each of the inverters 23 and 27 are selected to have a threshold voltage defining an upper and lower voltage limit for charging the bit lines. By selecting the length and width ratios of each of the PMOS and NMOS transistors 21, 22 and 25, 26 comprising each of the inverters 23 and 27, it is possible to establish different thresholds for each of the inverters. In a system where VDD equals 5 volts, the threshold for inverter 23 may advantageously be set at 2 volts and the threshold for inverter 27 set at 3 volts by selecting the appropriate width to length (W/L) parameters for each of the transistors.

A voltage driving circuit 35 is shown comprising a PMOS transistor 33 and NMOS transistor 34. These serially connected transistors are connected across the voltage supply VDD. The junction of the serially connected transistors 33 and 34 is used to drive current into the bit line terminal 20 or sink current from bit line 20 to maintain the voltage potential on the bit line 20 within the established thresholds of 2 and 3 volts.

Figure 3:
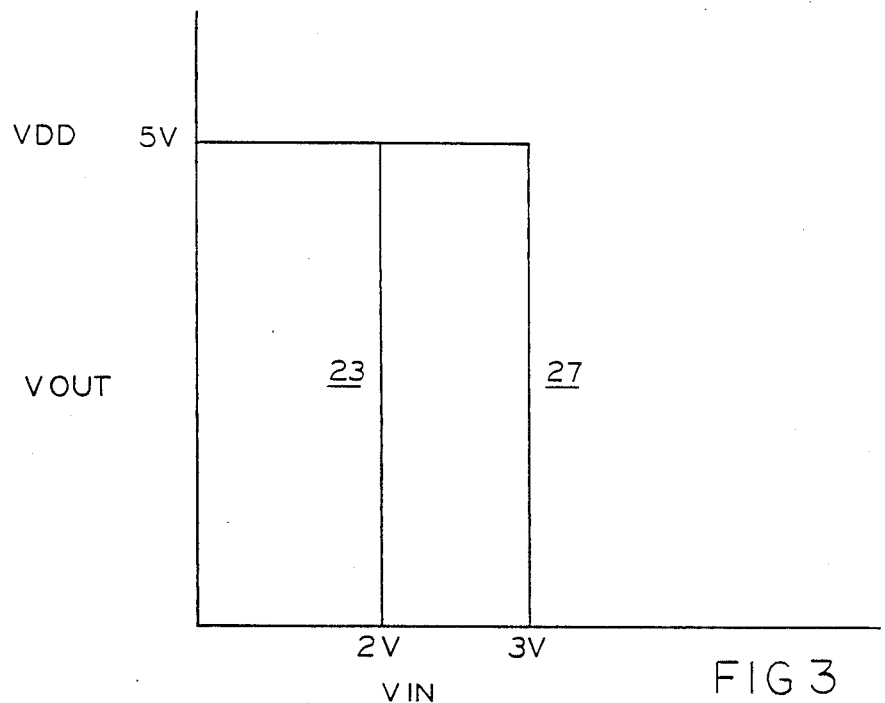
FIG. 3 illustrates the operation of the inverter circuits as a function of bit line potential.

The operation of the circuit of FIG. 2 can be briefly described with respect to FIG. 3. FIG. 3 illustrates the operation of the inverter circuits 23 and 27 of FIG. 2. When the input voltage shown in FIG. 3, corresponding to the bit line terminal potential 20, is less than 2 volts, inverter 23 will provide a full logic 1 output of 5 volts. When the threshold of 2 volts is reached by the voltage on the bit line terminal 20, inverter 23 will switch states, going to substantially 0 volts. However, since the bit line terminal 20 potential is below the threshold of inverter 27, shown to be 3 volts, the output of inverter 27 remains high until such time as the bit line to terminal 20 potential exceeds 3 volts.

The output terminals of the inverters 23 and 27 are coupled via inverters 30 and 31 to the voltage drive circuit 35. In operation, when the bit line driving terminal 20 potential is less than 2 volts, inverter 23 will enable transistor 33 and inverter 27 will disable conduction of transistor 34. Thus, during this condition, the bit line terminal 20 will be charged with a current from the source VDD through transistor 33. Once the potential at bit line terminal 20 reaches 2 volts, the inverter 23 will switch state, as shown in FIG. 3, and transistor 33 will no longer conduct driving current to the bit line terminal 20. Thus, the bit line 20 will be charged to a threshold voltage which is slightly above 2 volts.

If a transient is experienced on the bit lines 20 such as to raise potential of the bit line terminal 20 above 3 volts, a relatively rare occurrence, the bit line 20 would be overcharged. However, the inverter 27 will prevent the bit line 20 from being charged beyond 3 volts. If this condition should occur, the inverter 27 will switch states from a logical 1 output to a logical 0 output. This is coupled via inverter 31 to the NMOS transistor 34 which will be rendered conducting. The excessive charge on the bit line will be drained through bit line terminal 20 through the conducting NMOS transistor 34. Once the potential on the bit line terminal 20 decreases below 3 volts, the inverter 27 will switch states to a logic 1 condition, rendering the NMOS transistor 34 non-conducting.

Figure 4:
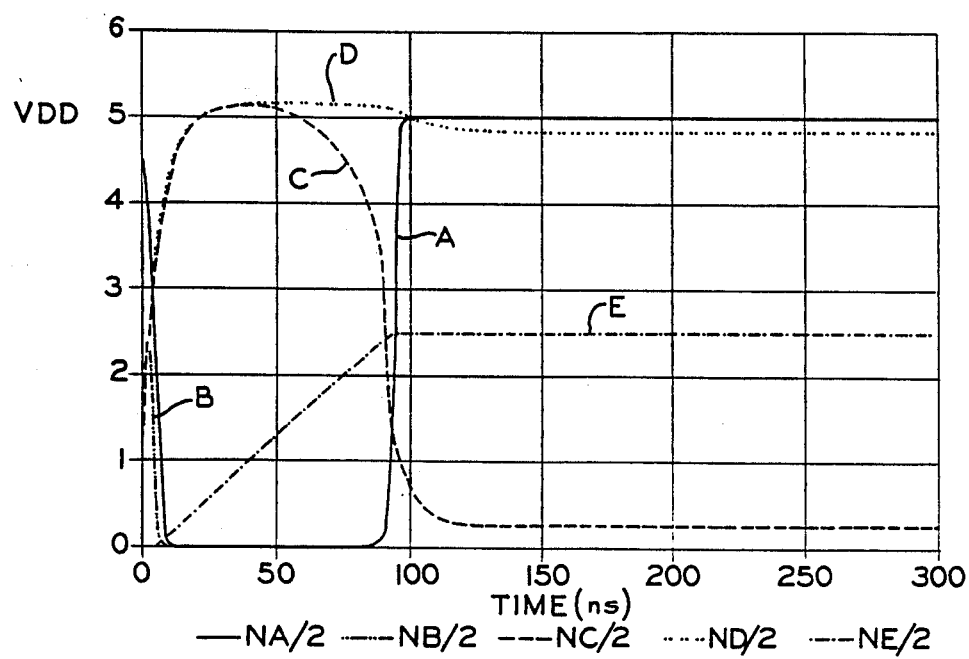
FIG. 4 illustrates the node potentials for the circuit of FIG. 2.

A more detailed illustration of the operation of FIG. 2 can be seen in FIG. 4. FIG. 4 demonstrates how the circuit operates by illustrating the node potentials in the circuit. The output potential of the inverters 23 and 27 are represented by the curves C and D, respectively. The inverted outputs of inverters 23 and 27 are represented by curves A and B.

Upon initialization of the circuit, it can be seen that the inverter output C is initially at 0 volts, which will result in node A being driven low, enabling the transistor 33 to conduct and charge the bit line terminal 20, shown as curve E, to a potential which is substantially half VDD. The output of the inverter 23, shown as curve C, will increase until the threshold for the inverter 23 is reached, at which time it decreases dramatically. At the same time, it can be seen that once the potential of 2½ volts is reached, inverter 23 rapidly changes state. Due to small leakage current conduction, the output of inverter 27 shown as D will remain slightly below VDD once the terminal threshold voltage of 2½ volts is reached on the inverter inputs.

As can be seen from FIG. 4, the switching time and charging time for obtaining the final voltage is less than 100 nanoseconds, making the circuit extremely fast in achieving its threshold potential.

When the circuit is in its quiescent condition, outside the precharging time interval the voltage at the bit line terminal 20 is maintained within the threshold region 2 to 3 volts and very little power consumption takes place. Specifically, the only power consumption by the circuit is a result of leakage current, as none of the gates are in a conducting state. Thus, the total power overhead added to the memory is nearly inconsequential.

Referring to FIG. 5, there is shown the time required to charge the bit line from 0 volts to the threshold potential, or to discharge the bit line from 5 volts to the threshold potential. It is seen that the desired half-sensing bit line potential can be obtained in less than 180 nanoseconds during the precharge interval.

As FIG. 6 illustrates, the circuit is capable of driving current of 40 mA or sinking a discharging current of 40 mA. The foregoing circuit can be manufactured in CMOS technology with a comparatively high yield. By selecting the inverter thresholds to be far enough apart so that ordinary tolerances obtained in establishing threshold voltages in CMOS technology do not result in any instability for the devices. The device channel lengths and widths are maintained large so that the effects of process fluctuations on inverter threshold voltages are maintained at a minimum. Thus, the CMOS technology process variation will not result in the overlap of the thresholds so as to cause the circuit to be unstable.

The foregoing threshold generator employs only a small number of transistors, thus efficiently using the available space on the silicon area. The circuit has a very high current drive ability, at least 40 mA, consuming very little power in the steady state condition. This attribute is specifically advantageous in static random access memory (SRAM) arrays. The power consumption by the device is independent of the charging capability.

Thus, there is described a new reference voltage generator for half-VDD sensing applications. Those skilled in the art will recognize yet other embodiments as defined by the claims which follow.

Having thus described my invention, what I claim as new and desire to secure by Letters Patent is:

1. In a solid state memory device, a threshold generator for generating a reference potential for precharging bit lines of said memory comprising:
    a first inverter circuit having a threshold voltage below said reference potential;
    a second inverter circuit having a threshold voltage above said reference voltage, said first and second inverters having a common input connection;
    voltage drive means to supply a current from a voltage source VDD, in response to an output signal of said first inverter circuit, and for discharging a current from said bit line in response to an output signal of said second inverter circuit; and,
    a bit line driving connection connecting said voltage drive means and inverter circuit common input connection, said inverter circuits supplying a charging current and discharging current to and from said bit line to maintain a voltage on said bit line driving connection within a range defined by said threshold voltages.

2. The threshold generator of claim 1 wherein each of said inverter circuits comprises a P channel FET connected in series with an N channel FET, said P channel and N channel FETs having a common gate connection.

3. The threshold generator of claim 1 wherein said first inverter circuit threshold is substantially 2 volts.

4. The threshold generator of claim 2 wherein said voltage drive means comprises:
    first and second serially connected P channel and N channel FET transistors, forming an output terminal, said serially connected transistors being adapted to be connected between terminals of a voltage supply VDD; and
    third and fourth inverter circuits connecting gate connections of said P channel and N channel FET transistors to output terminals of said first and second inverter circuits.

5. In a solid state memory device, a bit line driving circuit for precharging bit lines at one half VDD voltage levels comprising:
    a first inverter circuit having a threshold voltage which lies within the voltage range 0 to VDD;
    a second inverter circuit having a threshold voltage greater than said first inverter threshold and less than VDD, said first and second inverter circuits having a common input connection;
    first and second serially connected MOS transistors connected between first and second terminals of a voltage source of VDD volts, each having a gate connection;
    third and fourth inverter circuits connecting respective outputs of said first and second inverters to gate connections of said first and second serially connected MOS transistors; and,
    a feedback path connecting a junction formed by said first and second serially connected MOS transistors to said common input connection, whereby said common input connection is maintained at a voltage potential between said first and second inverter threshold voltages.

6. The threshold generator of claim 5 wherein said first and second inverters each comprise a series connected P channel FET and N channel FET having a common gate connection forming an input, each having a channel width/length ratio selected to provide a respective inverter threshold voltage.

* * * * *